(12) United States Patent
Zeng et al.

(10) Patent No.: US 6,373,715 B1
(45) Date of Patent: Apr. 16, 2002

(54) ORIENTING MULTIPLE PROCESSORS ON TWO SIDES OF A PRINTED CIRCUIT BOARD

(75) Inventors: Ming Zeng, San Jose; Sanjay Dabral, Milpitas, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/467,300

(22) Filed: Dec. 17, 1999

(51) Int. Cl.⁷ .............................. H05K 7/02; H05K 7/06; H05K 7/08
(52) U.S. Cl. ......................................... 361/760
(58) Field of Search .................... 361/760, 784, 361/785, 790, 794, 803, 810

(56) References Cited

U.S. PATENT DOCUMENTS 5,212,494 A * 5/1993 Hofer et al. ................. 343/859
5,999,437 A * 12/1999 Chengson et al. ............. 365/52

* cited by examiner

Primary Examiner—Brian Sircus
Assistant Examiner—Chandrika Prasad
(74) Attorney, Agent, or Firm—Kenyon & Kenyon

(57) ABSTRACT

A topology for mounting processors on opposite sides of a printed circuit board (PCB) orients rows of processor connection pins parallel to the bus orientation within the PCB and defines a relative 180 degree orientation between the opposing processors.

16 Claims, 9 Drawing Sheets

US 6,373,715 B1

ORIENTING MULTIPLE PROCESSORS ON TWO SIDES OF A PRINTED CIRCUIT BOARD

FIELD OF THE INVENTION

The present invention relates to signal routing. More particularly, the present invention relates to a topology for mounting processors on two sides of a printed circuit board (PCB).

BACKGROUND OF THE INVENTION

Processors, such as micro-processors found in a digital computer, read and write data using electronic signals. As the speed of processors continues to increase, along with the amount of data processed, the successful transfer of the electronic signals becomes more difficult. Given the clear trend towards faster and more complex processors in modem computer systems, improved techniques for transferring signals are needed in order to keep pace.

An "idealized digital electronic signal" 10 is shown in FIG. 1. Signal 10 may transition between a low voltage level 12 and high voltage level 14 over a period of time. Of course, not all signals 10 switch between high voltage 14 and low voltage 12 states each cycle, although, some may. These voltage levels typically correspond to a digital zero or one for time periods $t_2$ to $t_3$ and $t_4$ to $t_5$, respectively. The transition time between low voltage 12 and high voltage 14 is depicted as time period $t_1$ to $t_2$. The rate of transition between voltages 12 and 14 is referred to as the "edge rate". Preferably, the transitions from voltages 12 to 14 and from 14 to 12 are symmetrical. Electronic devices typically need some amount of time to read, or latch onto, a given voltage. That is, time periods $t_2$ to $t_3$ and $t_4$ to $t_5$ of signal 10 may have preferred minimum durations at voltages 12 and 14, dependent on the particular electronic devices used in a circuit and the sampling time needed by the devices. For a given edge rate and preferred minimum durations, a maximum frequency for signal 10 can be defined. Beyond this maximum frequency, devices may fail to correctly read signal 10. Alternatively, increasing the edge rate of a signal 10, at a given frequency would increase the duration at voltages 12 and 14. However, a faster edge rates may increase noise, that may also complicate reading the intended signal value. Discontinuities in the signal path also tend to increase the noise.

As will be further explained below, the maximum edge rate for a given design is correlated to the length of the conductors connected to the processor. That is, fast signal transition times work best with short conductors. Also, short conductors permit signals to travel their entire lengths faster than longer conductors. However, the design of a system is typically based on a worst case situation where all possible signal 10 transitions must be considered. Thus, the general design guideline is to keep signal paths short for the best signal transmission performance.

There are many possible topologies, or signal routing paths between the components of a computer system. As a general rule-of-thumb, designers try to keep signal paths short. However, there are many possible topologies and design choices. It would be advantageous to define topologies, or design guidelines for achieving such topologies, so that adequate signal transmission performance for the entire system is accomplished in systematic way. Current trial and error layout methods are cumbersome and, as system complexity increases, are more difficult for designers work with using rule-of-thumb such as keeping signal paths short.

Many computer system applications call for multiple processors working together. The system architecture for such multiple processor systems can take many forms. For example, using separate printed circuit boards (PCBS) for connecting individual processors to the overall system is known in the art. However, the transfer of signals 10 among separate PCBs takes time, and this may be a constraint on systems using relatively fast processors. Combining multiple processors on a single PCB is one approach to keeping the signal paths short. There are, however, many possible ways of mounting the multiple processors on a single PCB, and routing signals 10 among them.

The present invention considers factors including the lengths of signal paths, both within the processors and on the PCB, the relative orientation of the conductors, and the relative orientation of similar processors in order to achieve an improved quality of signal 10 transmissions. A signal path may be divided into two elements, as will be further described below, a stub and an offset. An embodiment of the present invention matches long stub lengths with long offset length, and short stub lengths with short offset lengths in order to define a topology that improve the signal transmission characteristics. Such a topology has the additional benefit of simplifying the layout of signal paths for a system with multiple processors.

SUMMARY OF THE INVENTION

A topology for mounting processors on opposite sides of a printed circuit board (PCB) orients rows of processor connection pins parallel to the bus orientation within the PCB and defines a relative 180 degree orientation between the opposing processors.

DETAILED DESCRIPTION

An embodiment of the present invention is directed toward a topology for mounting processors on both surfaces of a printed circuit board (PCB). The topology arranges the processors such that the long stub lengths of a given processor tend to pair with or long bus offsets on the PCB, and short stub lengths pair with short bus offsets. This topology has been shown to improve overall signal 10 transmissions characteristics of the PCB by reducing the noise caused by reflections. Throughout this specification the terms bus and trace are used interchangeably. Bus is intended to mean an electrically conductive pathway for electrical signals oriented substantially in a particular direction. The bus may be embedded between layers of the PCB.

Figure 2A:
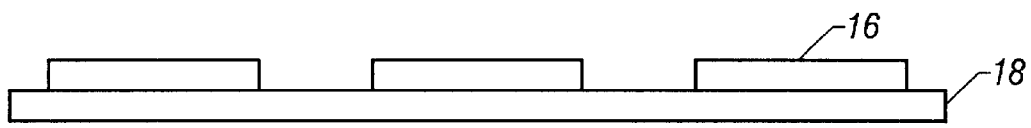
FIGS. 2A–2C are sectional views of various layouts for mounting multiple processors on a PCB.
Figure 2B:
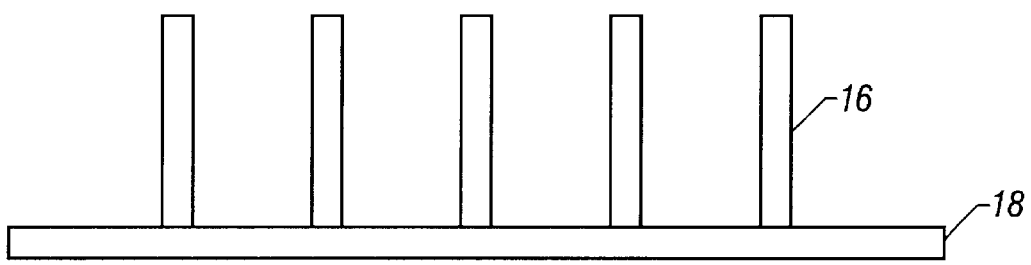

Many applications call for multiple processors working together and mounted on a single PCB. Such a multiple processor architecture may take many forms, such as, but not limited to, those shown in FIGS. 2A–2C. In each, multiple processors 16 are mounted on PCB 18. Often, many of the processors 16 are identical, although one or more may differ. Multiple processors configured as shown in FIGS. 2A and 2B typically require longer total signal paths to connect a given number of processors 16 than that shown in FIG. 2C, making them less attractive.

Figure 3:
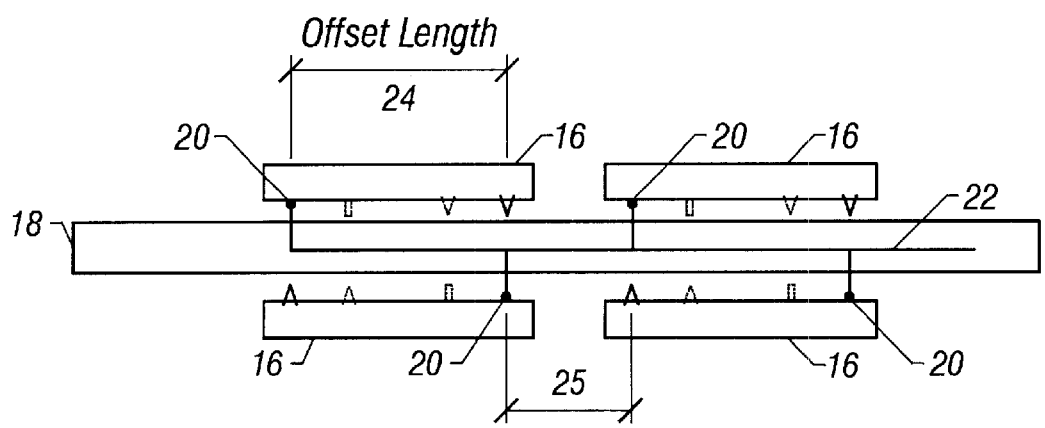
FIG. 3 is a sectional view of the connection of multiple processors to a bus.

There is, however, a complication in using a multiple processor layout with similar processors 16 on two sides of a PCB 18; instead of lining up, the identical connection pins of process or 16 to PCB 18 are offset from of each other. Often, the multiple processors will be identical, however, the present invention is not intended to be limited to identical processors. Referring to FIG. 3, four processors 16 are shown mounted on two sides of PCB 18, each with a common connection pin 20. Typically, each connection pin 20 of a given type of processor needs to be electrically connected to a common bus 22 within PCB 18. Because processors 16 have similar pinouts, whether mounted on the top or bottom surface of PCB 18, the connections between adjacent processors mounted on opposite sides of PCB 18 include an offset length 24. This offset 24 is fixed for a given connection pin 20 and processor pinout. For processors with multiple rows of connection pins 20, there may be multiple offsets 24. A minimum length 25, equal to offset length 24, is preferably maintained between common connection pins 20 on all adjacent processors.

The present invention considers offset 24, the orientation of bus 22, as well as the signal routing and pinout of a particular processor 16 to specify a preferred topology for mounting multiple processors 16 on PCB 18. In this way the quality of digital signals 10 for the multiple processor PCB 18 may be enhanced over topologies that ignore these factors.

First, some terms related to the topology and signal path will be defined. The term processor, as used in this specification, includes both the silicon die or "chip", as well as any package/connector/interposer/socket for mounting the processor on PCB 18. The processor could also be made from a material other than silicon, such as gallium arsenide. Processor 16 will connect to PCB 18 with a pinout, comprised of a number of individual electrical connections referred to as connection pins 20. Everything "upstream" of the pinout including connections between the silicon die and the pinout, will be considered a part of the processor. The pinout and connection pins 20 may take any form of electrical connection to PCB 18, such as, but not limited to a land grid array (LGA) or through-hole connections. The present invention is not intended to be limited to any particular processor to PCB 18 mounting technique.

A stub length is the length of conductor between a bus 22 and the point of connection on the silicon die. Thus, the stub length is the sum of the conductor length within processor 16, as defined above, and the conductor length between the processor pinout and bus 22. For a given processor, only the later length can be varied by altering the topology of how processors 16 are mounted on a PCB.

Offset 24, as shown in FIG. 3, is the length along bus 22, within PCB 18, between the identical connection pins 20 on two processors 16 mounted opposite each other on PCB 18. An embodiment of the present invention takes the portion of the stub length within processor 16 as given. That is, only the topology "downstream" from the pinout of processor 16 is variable. Of course, as with most any engineering design, altering the given input (here, the internal topology of the processor) may well allow further optimization. The present invention is not intended to exclude such an optimization.

Figure 2C:
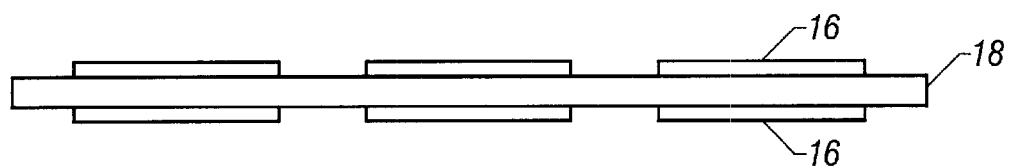

Using short stub lengths for the signal paths is but one design parameter. For a given processor 16, only a portion of the stub length is variable with the remainder inherent with the selection of a particular processor 16. There will also be a range of stub lengths for even the most optimal signal path topology. Mounting processors 16 on both sides of PCB 18, as shown in FIG. 2C, does tend to keep the signal paths short, compared to alternative layouts. However, there are many possible topologies for processors 16 on two sides of PCB 18. The present invention teaches a rational methodology for selecting among some of the choices. In this context, topology is the "geometry" or the arrangement of processors 16 on PCB 18 and the routing of signals. Specifically, the present invention is directed to the orientation of processor 16 connection pins 20 with respect to the orientation of buses 22 within PCB 18, and the relative orientation of adjacent processors 16 on opposite sides of PCB 18 in order to achieve improved signal transmission characteristics. Those of ordinary skill in the art will recognize that an electrically conductive path is required between connection pins 20 and buses 22, such "vias" are well known in the art and the present invention is not intended to be limited to any particular type of connection between the connection pins 20 and buses 22.

There are design considerations, other than signal path lengths, such as the need for heat dissipation by processors 16. The present invention is not intended to limit any other such design consideration, only to provide a topology consistent within these other design requirements.

A system with multiple processors 16 mounted on PCB 18 may have a very large number of signal paths. The behavior of signals on each of these signal paths depends on how processors 16 are mounted on PCB 18, relative to both the other processors 16 and the layout of PCB 18. Choosing a topology typically involves finding one that gives the best signal 10 transmission characteristics of the worst case path for the entire set of signal paths, not merely optimizing a few paths. However, the large number of signal paths complicates the process of finding an acceptable topology. The large number of possible permutations makes the design difficult and typically requires extensive simulations of the many signal paths. That is, pairing a particular offset length 24 and stub length for each signal path is a two-dimensional problem. The present invention provides a set of design rules that reduces what was previously a two-dimensional problem to a more manageable one-dimensional problem. Thus, in addition to improved signal transmission performance, the present invention may reduce both the engineering effort to arrive at an acceptable topology and the time required to validate a proposed topology.

Figure 4A:
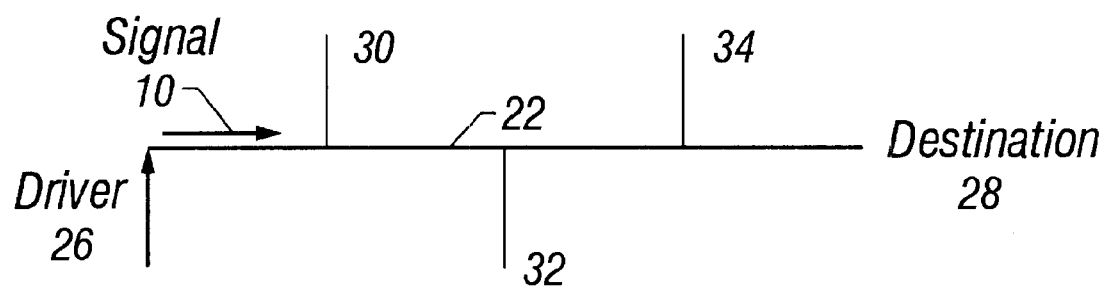
FIGS. 4A–4B depict an electrical signal on a bus and the effect of stubs.
Figure 4B:
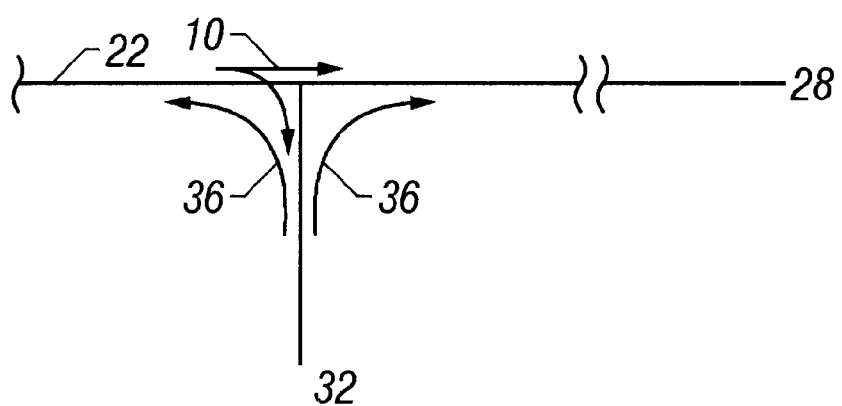

One problem encountered when mounting processors 16 on opposite sides of PCB 18 is noise. The noise is most pronounced on signal paths with relatively large stubs and small offsets when using signals with fast transition times. Referring to FIG. 4A, a signal 10 is generated by driver 26, for destination 28 along bus 22. Also connected to bus 22 along the signal path are stubs 30, 32 and 34. Such stubs may be connections to other processors 16 on PCB 18. As the edge rate is increased, stubs 30, 32 and 34 cause a reflection of signal 10, as depicted in FIG. 4B. The main signal 10 reflects due to the presence of stub 32 and the reflected signal 36 is then passed along bus 22, with a time delay relative to signal 10. Similarly, stubs 30 and 34 may cause reflections, although the time delays may each differ. The net effect of the reflected signals 36 is noise imposed on signal 10 as it is received at destination 28, and with the worst signal-to-noise ratio (S/N) in signal paths where stubs 30, 32 and 34 are long relative to bus 22.

Figure 1:
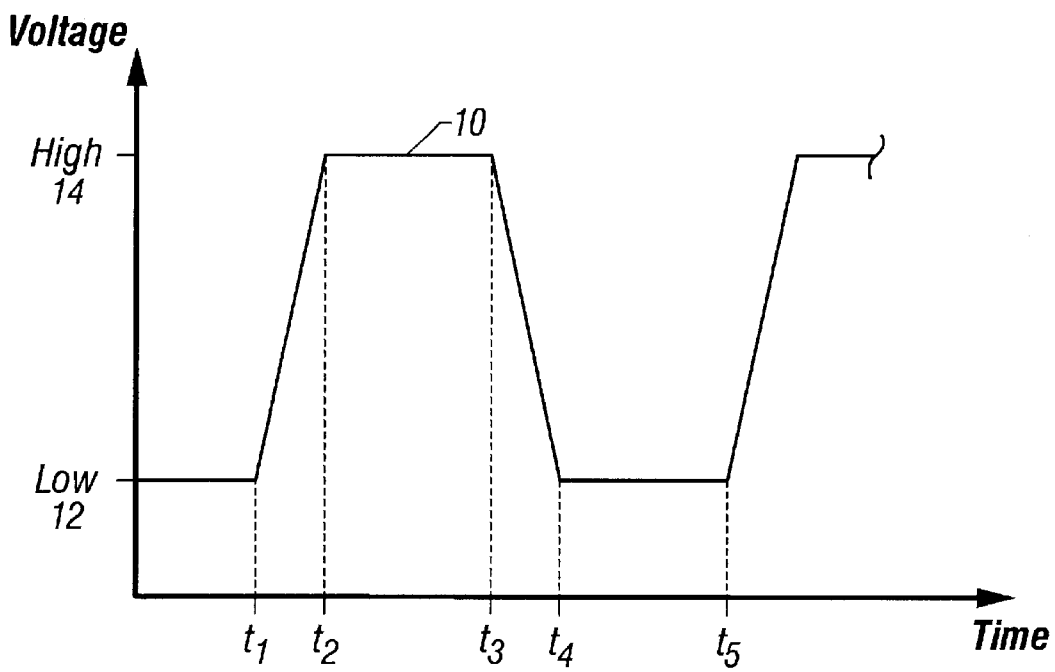
FIG. 1 illustrates an idealized digital electronic signal as is known in the art.
Figure 5A:
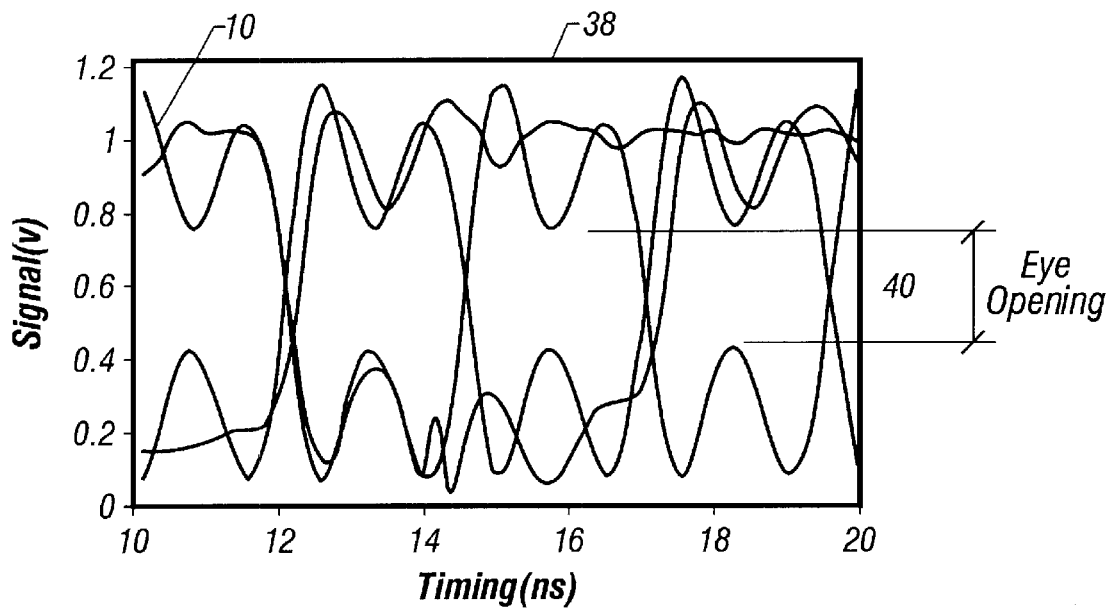
FIGS. 5A and 5B are eye diagrams measuring envelopes of signal voltage versus time for selected signal paths on a PCB.
Figure 5B:
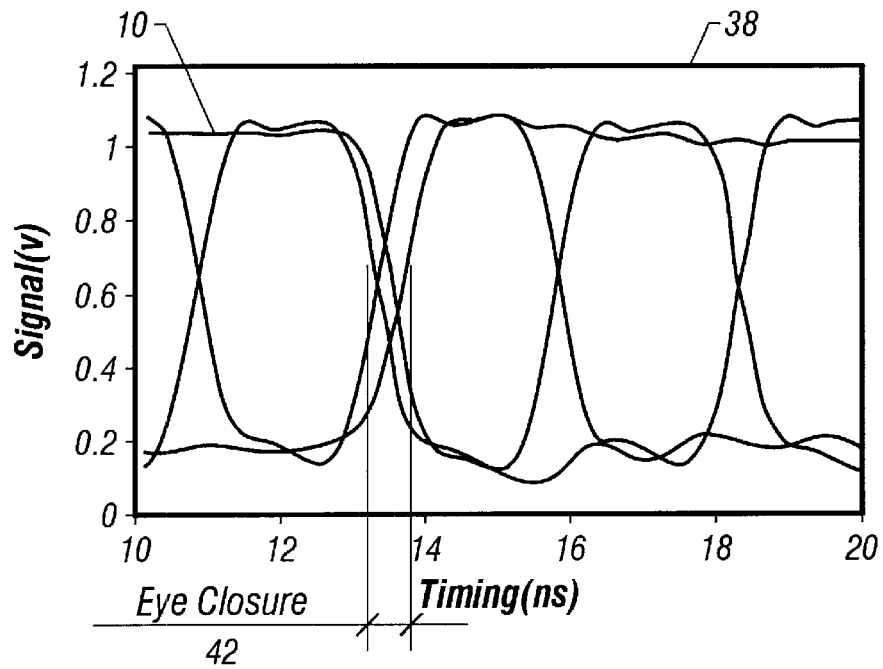

Evaluation of signal performance for various signal paths may be made using eye diagrams 38, such as shown in FIGS. 5A–5B. Eye diagrams 38 display an envelope of the timing of signals 10 along the various paths of PCB 18. For an idealized signal 10 as shown in FIG. 1, eye diagrams 38 provide a measure of the noise and delay imposed on for the signal, as it is received, as well as depicting the variations along the different signal paths. Preferably, eye diagrams 38 would include either all of the possible signal paths on a given PCB 18, or envelop of the worst cases of signal noise and delay. The system eye opening 40 is defined as the vertical distance, measured in units of voltage between the high voltage and low voltage signals, measured away from the signal transition, taking into account the noise from reflected signals 36. A topology with a higher eye opening value 40 exhibits better signal transmission performance than a low eye opening value 40, in term of noise. The eye opening 40 can be thought of as the minimum sensitivity required to differentiate between logical ones and zeros for any signal. Often, multiple processor topologies have eye opening values 40 governed by adjacent processors sending and receiving data to each other.

The system eye closure 42 is the horizontal width between the enveloped signal transitions, measured in units of time, at a particular point in the voltage range. A small eye closure is typically desirable, indicating there is a small variation in the timing of signal transitions over the many signal paths. That is, a relatively large eye closure 42 decreases the time period when a signal from any given signal path is certain to be at stable high or low voltage level for reading at a given destination.

Because the critical eye opening value 40 is often found to be governed by adjacent processors 16 with large stubs small offsets, the present invention pairs signal paths with large stubs and large offsets together. Similarly, those with short stubs are paired with short offsets. For a given processor 16, these pairings may be accomplished by specifying an orientation of the processor 16 connection pins 20 with respect to buses 22, and with respect to the adjacent processor 16, located on the opposite side of PCB 18.

Figure 6:
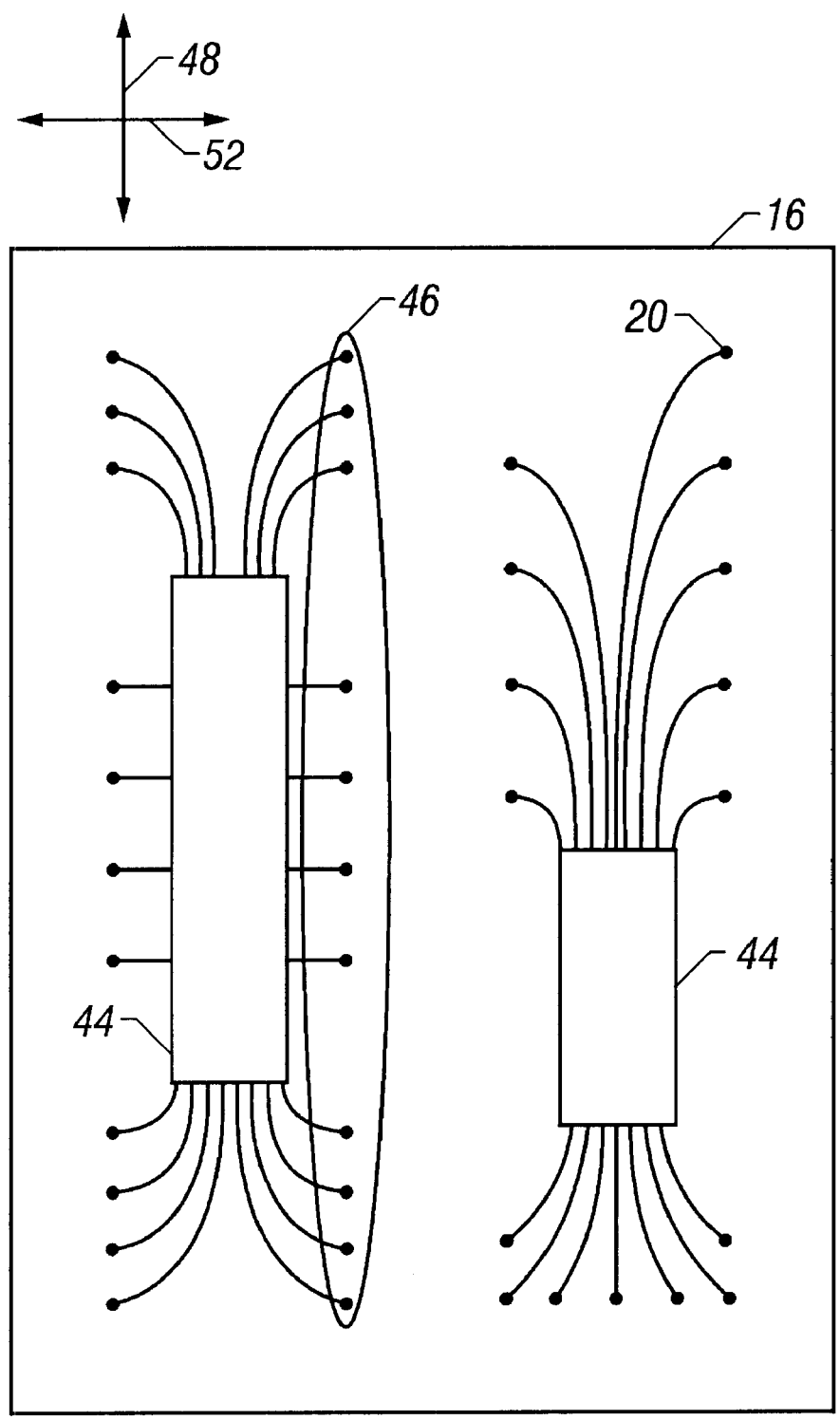
FIG. 6 illustrates a processor and associated connection pins.

FIG. 6 shows a processor 16 with two I/O pad areas 44 and a number of connection pins 20 for connection to PCB 18. Although connection pins 20 may be arranged in virtually any pattern, there are often rows 46 of pins 20 oriented so that they define a prevailing pin row axis 48 orientation. The present invention is not intended to be limited to any particular pinout, number of I/O pads 44 or number of rows 46; only that a prevailing pin row axis 48 can be identified. As explained above, it is the pinout connection to PCB 18 that is examined for a pin row axis 48.

Orienting processors 16 on PCB 18 so that pin row axis 48 is parallel to the majority of buses 22 on PCB 18 is one step to achieve the topology of an embodiment of the present invention. Preferably, processors 16 are located close to those buses 22 that are most heavily used by processors 16, as would be done to keep the lengths of signal paths to a minimum. As is readily recognized by those of ordinary skill in the art, there may be many buses connected to processor 16, it is the most heavily used buses 22, such as those used data and address signals, that would carry the most influence in locating processors 16 on PCB 18 in accordance with an embodiment of the present invention.

The last "degree of freedom" after locating processors 16 close to and parallel to buses 22 is defining the orientation of two adjacent processors 16, on opposite sides of PCB 18, with respect to each other. Perpendicular to pin row axis 48, a processor width axis 52 can be defined for processor 16. The orientation of processors 16 on opposite sides of PCB 18 are rotated 180° about processor width axis 52 with respect to each other.

Figure 7:
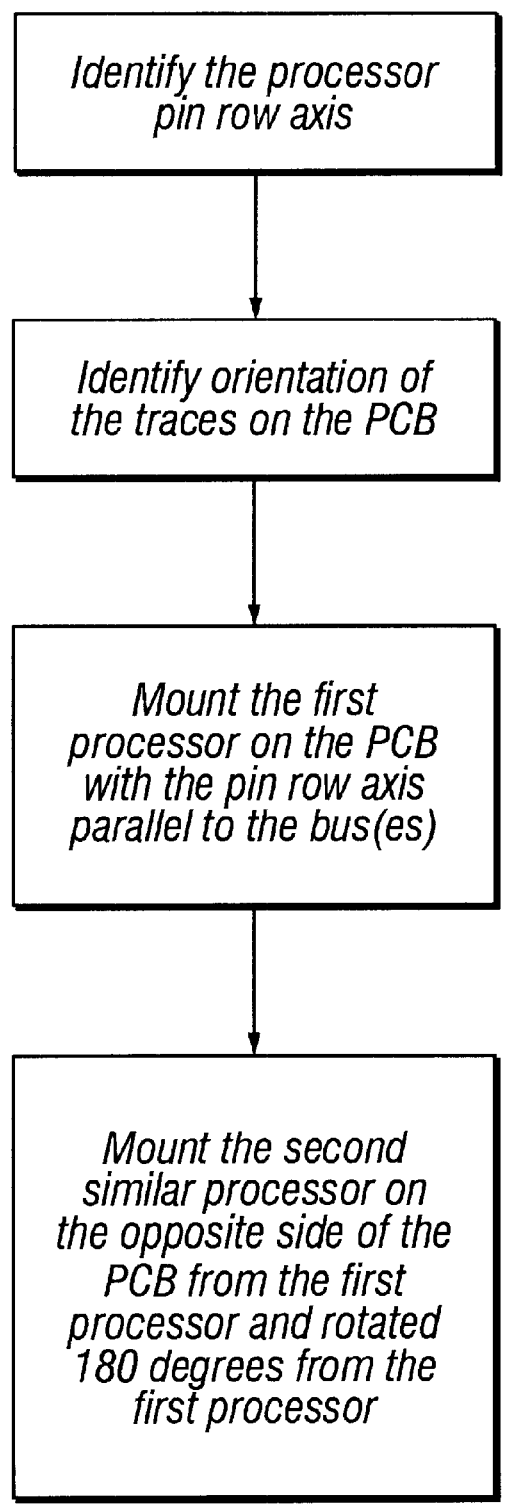
FIG. 7 is a flowchart for mounting processors on a PCB in accordance with an embodiment of the present invention.

For a given pair of processors 16 to mount on a given PCB 18, the geometry of each can be identified. That is, the pin row axis 48 of each processor 16 and bus 22 orientation of PCB 18 are predefined. Assuming the designer wants to mount processors 16 so they are adjacent and on opposite sides of PCB 18, there is still the question of how best to orient processors 16 with respect to PCB 18. An embodiment of the present invention orients the pin row axis 48 parallel to bus 22. A flow chart for creating the topology of an embodiment of the present invention is shown as FIG. 7. The process may be repeated for each processor 16, or pair of processors, on the PCB 18.

In an embodiment of the present invention, processors 16 located on opposite sides of PCB 18, may be offset from each other by a processor pair offset distance. That is, instead of being mounted directly above and below each other. Although such an offset may slightly increase the length of the signal paths, it allows for a less complex layout of the buses 22 within PCB 20. Otherwise, connection pins 20 that "sit exactly on top of each other" might add noise and require more complex connections than standard through-hole vias. The processor pair offset distance may be in any direction along the surface of PCB 18.

The present invention may also be used for mounting odd numbers of processors 16 on a PCB 18. However, these "unpaired" processors 16 are not likely to benefit from the topology of the present invention to the same extent as "paired" processors 16.

Figure 8:
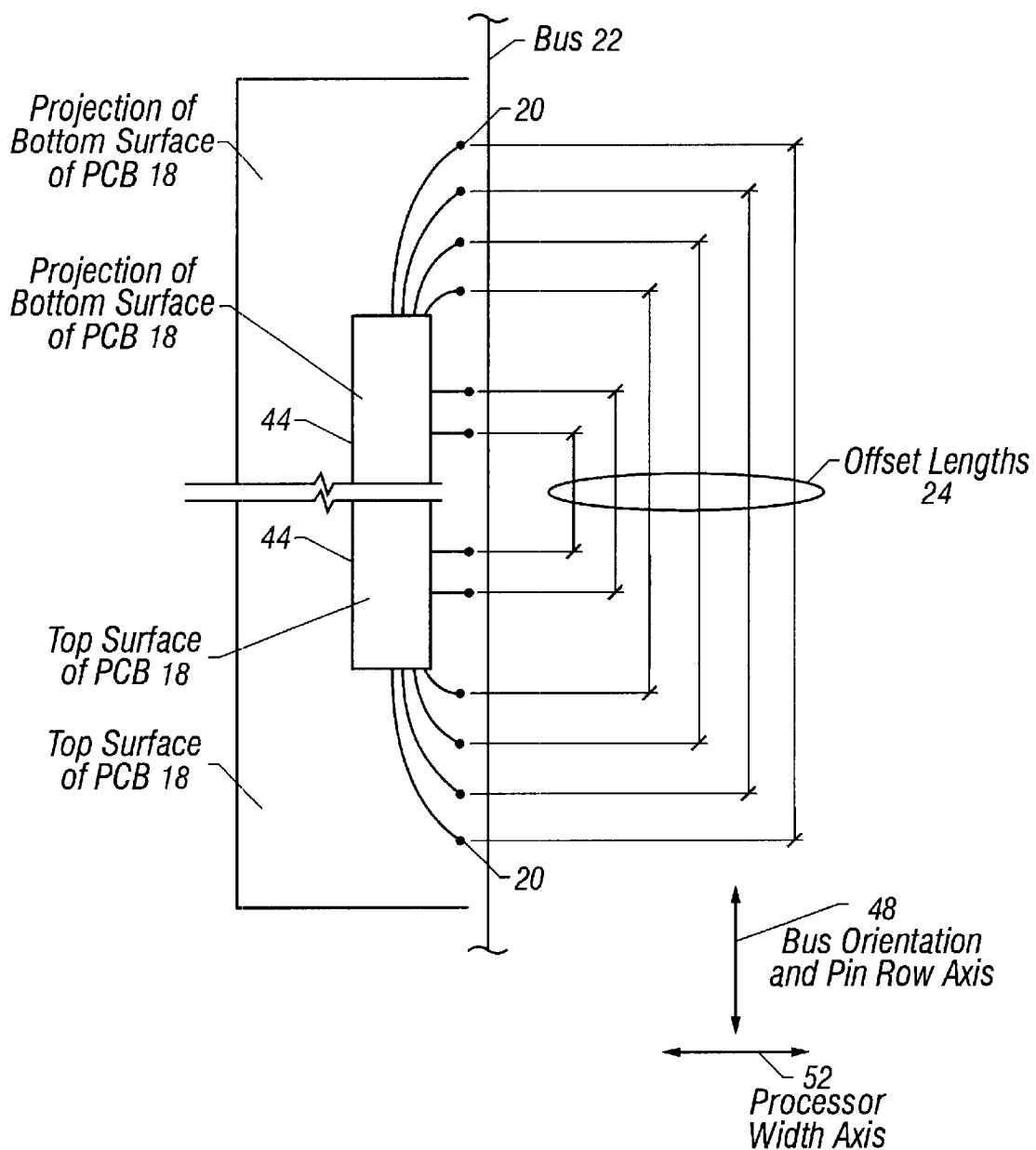
FIG. 8 depicts an embodiment of the present invention with rows of processor pins parallel to a bus orientation.

FIG. 8 illustrates the pairing of short stub lengths with short offsets 24 and long stubs with long offsets 24 in accordance with an embodiment of the present invention. FIG. 8 shows portions of two I/O pads 44 from the left side of the processor 16 shown in FIG. 6. The bottom half of FIG. 8 corresponds to the top surface of PCB 18, with the pins 20 oriented just as they are shown in FIG. 6. The top half of FIG. 8 corresponds to the projection of bottom surface of PCB 18, the pins 20 have been rotated 180° around processor width axis 52. The common connection pins 20, from both sides of PCB 18 are connected to bus 22. For clarity, only six pairs of connection pins 20 are shown. Omitted from FIG. 8, for clarity, are the portions of the stub lengths between the connection pins 20 and bus 22. The distance along bus 22 of the connection between pins 20 with identical functions are the offset lengths 24. The offset 24 generally increases for pairs of identical pins 20 with increasing stub lengths. The effect is the largest when bus 22 is located directly between connection pins 20 on both sides of PCB 18. That is, as the distance between the pin row axes 46 and bus 22 increases, each stub length increases by the same amount, while the offset length 24 remains constant.

Figure 9:
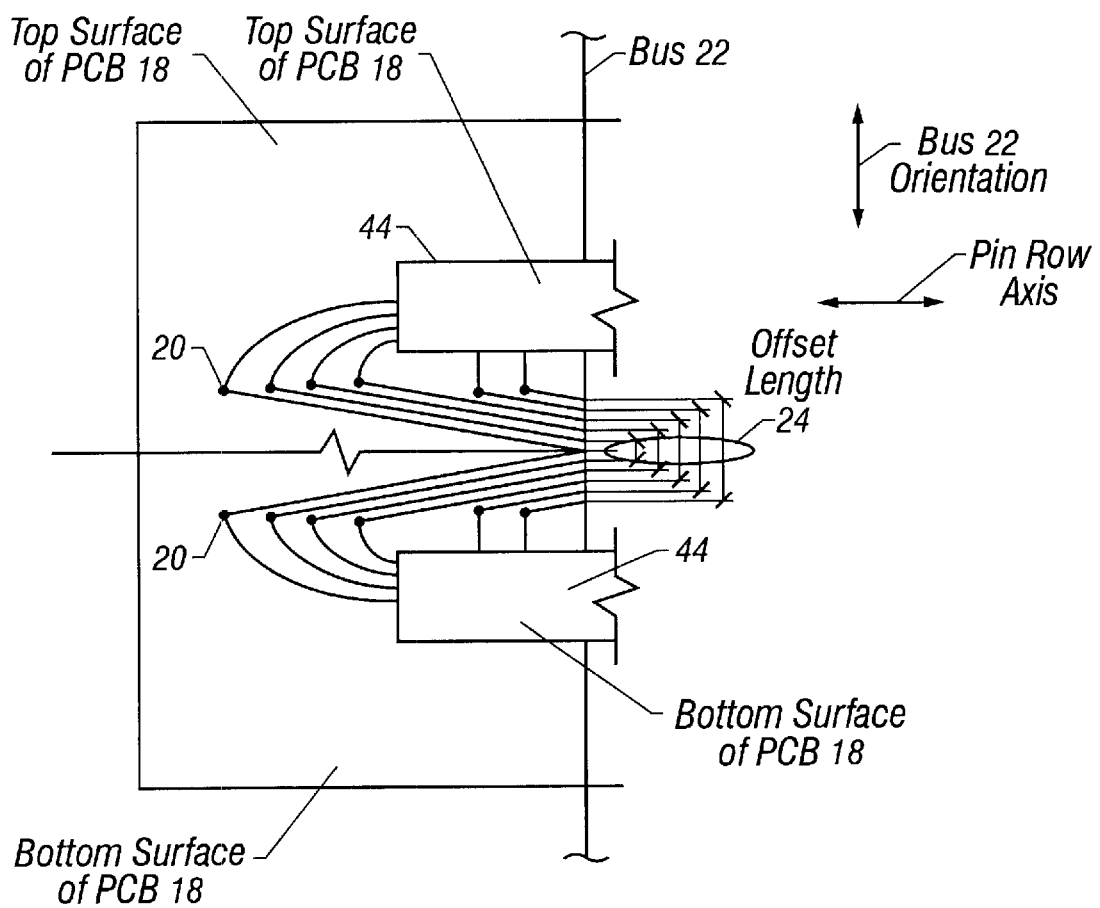
FIG. 9 depicts a prior art mounting orientation, with rows of processor pins perpendicular to a bus orientation.

FIG. 9, in contrast to FIG. 8, show offset lengths 24 for processors 16 oriented so that bus 22 is perpendicular to pin row axis 48. Again, only six pairs of connection pins 20 are shown for clarity. The left side of FIG. 8 corresponds to processor 16 on the top surface of PCB 18, and the right side a projection of processor 16 from the bottom surface. Although the bottom processor is rotated 180° around pin row axis 48, the offset lengths 24 would be the same if the rotation were around processor width axis 52. The result is that long stub lengths have the shortest offset 24, and as the stub lengths tend to decrease as the offsets 24 increase. Thus, FIG. 9 exhibits the wrong stub length to offset 24 pairing for preferred noise characteristics. The S/N characteristics of a FIG. 8 topology are typically significantly improved over a FIG. 9 topology.

Figure 10A:
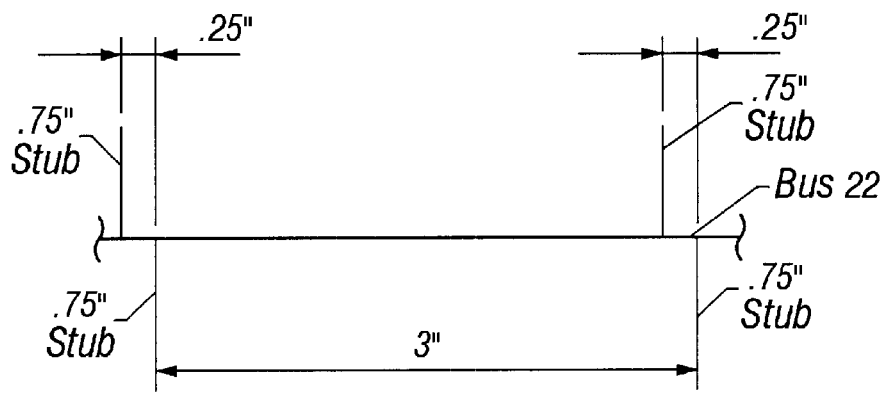
FIGS. 10A–10C are net diagrams depicting alternative topologies.
Figure 10B:
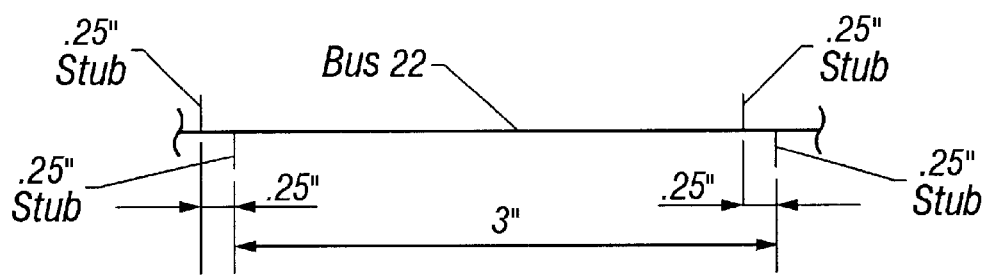
Figure 10C:
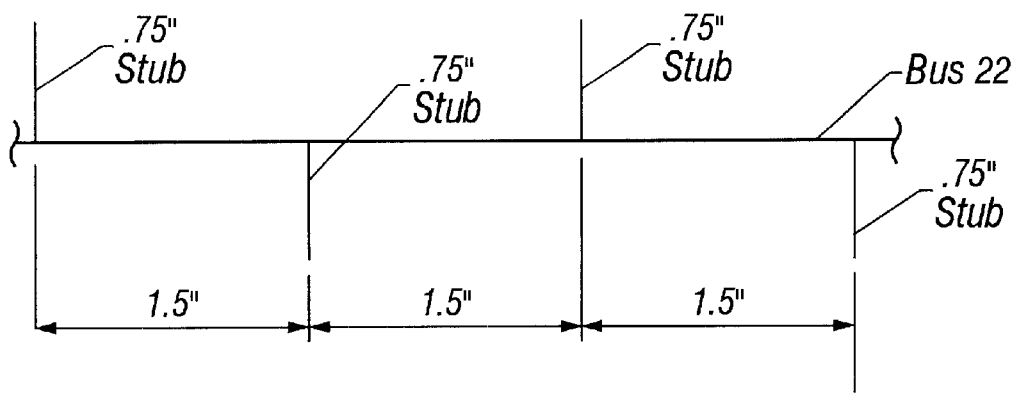

FIG. 10A–10C are schematic diagrams depicting the stub and offset 24 for three networks (net diagrams) of interconnected processors, similar FIG. 4A. In each of the figures there are two pairs of processors connected to bus 22 with stubs. FIG. 10A, would likely exhibit the worst S/N characteristics of the three, with relatively long (0.75") stubs lengths paired with relatively short offsets 24. Note that a mixture of short and long offsets 24 will cause the short offsets to effect the envelope of signal characteristics. Improvements in the S/N may come from shorter stub lengths, such as the 0.25" in FIG. 10B, because of the smaller reflections caused by shorter stubs. Or, without decreasing the stub length, balancing the network, as shown in FIG. 10C. An embodiment of the present invention tends to improve the S/N of a system, as measured by enveloped eye diagrams 38, by creating networks more like those shown in FIGS. 10B and 10C than in 10A. As an added benefit, the challenge of routing signal is reduced from a two-dimensional problem to one-dimension.

The improved signal performance using an embodiment the topology of the present invention was clearly demonstrated by data from circuit simulations. Eye diagrams 38, similar to those shown in FIGS. 5A and 5B, were created for various signal paths using different topologies. Values for the critical eye opening 40 and eye closures 42 were obtained from simulations of multiple signal paths, or nets. Two multiple processor 16 circuits were simulated, in both case pairs of processors 16 were mounted opposite each other on a PCB 18. In the "control" case, the buses 22 were oriented perpendicular to the pin row axes 48 similar to FIG. 9. In the other case, the processors were rotated 180° with respect to each other and the buses 22 were oriented parallel to the pin row axes, as taught by an embodiment of the present invention and shown in FIG. 8. The simulation data is summarized in Table 1.

TABLE 1

| | Embodiment of Present Invention | | | | | Control | |
|---|---|---|---|---|---|---|---|
| | Net 1 | Net 2 | Net 3 | Net 4 | Net 5 | Net A | Net B |
| Eye Opening (mV) | 460 | 369 | 388 | 409 | 453 | 351 | 211 |
| Eye Closure (ps) | 480 | 526 | 564 | 525 | 518 | 562 | 576 |

The worst case noise margin, as measured by the eye opening 40, improved from 211 mV to 369 mV using the topology of the present invention, a 75% improvement. This 75% improvement is an envelope of eye openings 40 for the entire system, some signal paths improved more than 75%.

Although various embodiments are specifically illustrated and described herein, it will be appreciated that modifications and variations of the present invention are covered by the above teachings and within the purview of the appended claims without departing from the spirit and intended scope of the invention. Moreover, the present invention applies to a broad range of multiple processor architectures, and is therefore a general approach that includes a broad range of specific implementations.

What is claimed is:

1. A topology for an electrical device, including a plurality of processors, comprising:
    a printed circuit board (PCB) with a top PCB surface and a bottom PCB surface;
    a bus for carrying electrical signals, said bus routed within said PCB along a bus orientation axis;
    a first processor with a pin row axis, said first processor mounted on said top PCB surface with said pin row axis parallel to said bus orientation axis, said first processor electrically coupled to said bus; and
    a second processor, similar to said first processor, with a pin row axis, said second processor mounted on said bottom PCB surface with said pin row axis parallel to said bus orientation axis and rotated 180 degrees relative to said first processor about a processor width axis, said second processor electrically coupled to said bus.

2. An apparatus in accordance with claim 1, wherein:
    said bus is a data bus for transmitting a data signal.

3. An apparatus in accordance with claim 1, wherein:
    said bus is an address bus for transmitting an address signal.

4. An apparatus in accordance with claim 1, further comprising:
    a third processor mounted on said top PCB surface, said third processor electrically coupled to said bus.

5. An apparatus in accordance with claim 1, further comprising:
    a third processor mounted on said bottom PCB surface, said third processor electrically coupled to said bus.

6. An apparatus in accordance with claim 1, wherein:
    said second processor is mounted directly below said first processor.

7. An apparatus in accordance with claim 1, wherein:
    said second processor is offset from the projection of said first processor on said bottom PCB surface by a processor pair offset distance.

8. An apparatus for passing electrical signals among a plurality of processors on two sides of a PCB, comprising:
    a plurality of connection pins on each processor for electrically connecting the processors to the PCB, said connection pins oriented substantially along a pin row axis;
    a plurality of buses for conducting the electrical signals within the PCB, said buses oriented parallel to said pin row axis; and
    a plurality of vias for electrically connecting said connection pins to said buses.

9. An apparatus in accordance with claim 8, wherein:
    pairs of said processors are arranged on opposite sides of the PCB with an orientation of the opposing processors differing by 180 degrees about a processor width axis.

10. A method of arranging a plurality of processors on two surfaces of a printed circuit board (PCB), comprising:
    routing a bus within the PCB along a bus orientation axis;
    mounting the processors on two surfaces of the PCB;
    aligning a pin row axis of the processors parallel to said bus orientation axis;

aligning a pair of adjacent processors on opposite sides of the PCB so that each is oriented 180° apart, about a processor width axis, from the opposing processor; and electrically connecting the processors to said bus.

11. A method in accordance with claim 10, further comprising:

offsetting said pair of processors by a processor pair offset distance.

12. A method in accordance with claim 10, further comprising;

mounting an unpaired processor on the PCB with said unpair processor pin row axis parallel to said bus orientation axis.

13. A method in accordance with claim 10, wherein:

routing said bus along a bus orientation axis corresponds to a data bus for transmitting data signals.

14. A method in accordance with claim 10, wherein:

routing said bus along a bus orientation axis corresponds to an address bus for transmitting an address signal.

15. In a computer system using multiple processors, an apparatus for electrically connecting the multiple processors, comprising:

a PCB for mounting the multiple processors, said PCB with a top PCB surface and a bottom PCB surface;

a plurality of buses within said PCB for carrying electrical signals, said buses routed along a bus orientation axis;

a first processor with a pin row axis, said first processor mounted on said top PCB surface with said pin row axis parallel to said bus orientation axis, said first processor electrically coupled to said bus; and a second processor with a pin row axis, said second processor mounted on said bottom PCB surface with said pin row axis parallel to said bus orientation axis and rotated 180 degrees relative to said first processor, said second processor electrically coupled to said bus.

16. A computer system in accordance with claim 15, wherein:

pairs of said processors are arranged on opposite sides of said PCB with an orientation of the opposing processors differing by 180 degrees about a processor width axis.

* * * * *